United States Patent
Yamamoto et al.

(10) Patent No.: US 10,032,630 B1
(45) Date of Patent: Jul. 24, 2018

(54) METHOD OF MANUFACTURING SEMICONDUCTOR DEVICE

(71) Applicant: HITACHI KOKUSAI ELECTRIC INC., Tokyo (JP)

(72) Inventors: Katsuhiko Yamamoto, Toyama (JP); Hajime Karasawa, Toyama (JP); Kazuyuki Toyoda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 15/710,414

(22) Filed: Sep. 20, 2017

(30) Foreign Application Priority Data

Mar. 14, 2017 (JP) .................................. 2017-049002

(51) Int. Cl.
| | |
|---|---|
| *H01L 21/02* | (2006.01) |
| *H01L 21/30* | (2006.01) |
| *H01L 21/31* | (2006.01) |
| *H01L 21/027* | (2006.01) |
| *G03F 7/00* | (2006.01) |
| *H01L 21/311* | (2006.01) |
| *H01L 21/3065* | (2006.01) |

(52) U.S. Cl.
CPC ........ *H01L 21/0274* (2013.01); *G03F 7/0002* (2013.01); *H01L 21/3065* (2013.01); *H01L 21/31133* (2013.01)

(58) Field of Classification Search
CPC .............................. H01L 21/0274; H01J 49/04
See application file for complete search history.

(56) References Cited

U.S. PATENT DOCUMENTS

| | | | |
|---|---|---|---|
| 2013/0149811 A1* | 6/2013 | Hasegawa | ........... H01L 51/0005 438/99 |
| 2014/0087566 A1 | 3/2014 | Kato et al. | |
| 2015/0301445 A1 | 10/2015 | Komatsu et al. | |

FOREIGN PATENT DOCUMENTS

| | | |
|---|---|---|
| JP | 2011-018778 A | 1/2011 |
| JP | 2014-063884 A | 4/2014 |
| JP | 2015-216368 A | 12/2015 |

OTHER PUBLICATIONS

Lei Chen, Gerard Henein, James A. Liddle, Super-hydrophobic and/or Super-hydrophilic Surfaces Made by Plasma Process, May 8, 2009, NIST, Conference, https://www.nist.gov/publications/super-hydrophobic-andor-super-hydrophilic-surfaces-made-plasma-process.*

* cited by examiner

*Primary Examiner* — Mounir Amer
(74) *Attorney, Agent, or Firm* — Volpe and Koenig, P.C.

(57) ABSTRACT

There is provided a technique for facilitating a patterning process by the DSA appropriately and efficiently. According to the technique described herein, there is provided a method of manufacturing a semiconductor device, including (a) accommodating in a process chamber a substrate having a guide pattern thereon; (b) supplying a plasma of a first process gas into the process chamber to subject the substrate to first one of a first process for hydrophilizing the substrate and a second process for hydrophobizing the substrate; and (c) supplying a plasma of a second process gas into the process chamber to subject the substrate to second one of the first process and the second process other than the first one of the first process and the second process.

14 Claims, 10 Drawing Sheets

DIRECTION OF ROTATION

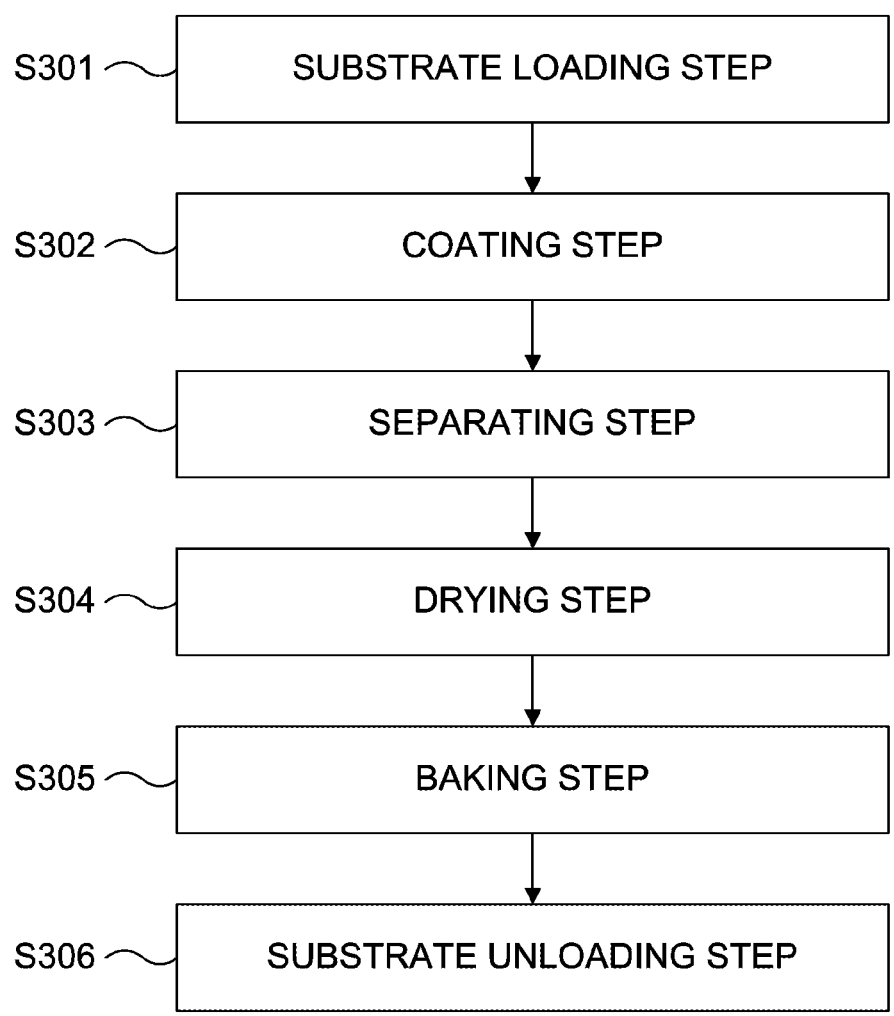

METHOD OF MANUFACTURING SEMICONDUCTOR DEVICE

CROSS-REFERENCE TO RELATED PATENT APPLICATION

This U.S. non-provisional patent application claims priority under 35 U.S.C. § 119 of Japanese Patent Application No. 2017-049002, filed on Mar. 14, 2017, in the Japanese Patent Office, the entire contents of which are hereby incorporated by reference.

BACKGROUND

1. Field

The present disclosure relates to a method of manufacturing a semiconductor device.

2. Description of the Related Art

Recently, semiconductor devices have become highly integrated or downsized. As a result, DSA (Directed Self-Assembly) lithography using directed self-assembly phenomenon of a block copolymer has received attention as a next-generation lithography technique.

SUMMARY

Described herein is a technique capable of performing patterning appropriately and efficiently by directed self-assembly lithography.

According to one aspect of the technique described herein, there is provided a method of manufacturing a semiconductor device, including (a) accommodating in a process chamber a substrate having a guide pattern thereon; (b) supplying a plasma of a first process gas into the process chamber to subject the substrate to first one of a first process for hydrophilizing the substrate and a second process for hydrophobilizing the substrate; and (c) supplying a plasma of a second process gas into the process chamber to subject the substrate to second one of the first process and the second process other than the first one of the first process and the second process.

BRIEF DESCRIPTION OF THE DRAWINGS

FIG. 9 illustrates an exemplary sequence of coating and curing of a photoresist material of the substrate processing according to the embodiment.

DETAILED DESCRIPTION

Embodiment

Hereinafter, an embodiment will be described with reference to the drawings.

(1) Summary of Patterning Process by Directed Self-Assembly Lithography

First, a patterning process according to the embodiment will be schematically described. The patterning process is one of semiconductor device manufacturing processes, and is performed using Directed Self-Assembly (DSA) lithography.

Figure 1:
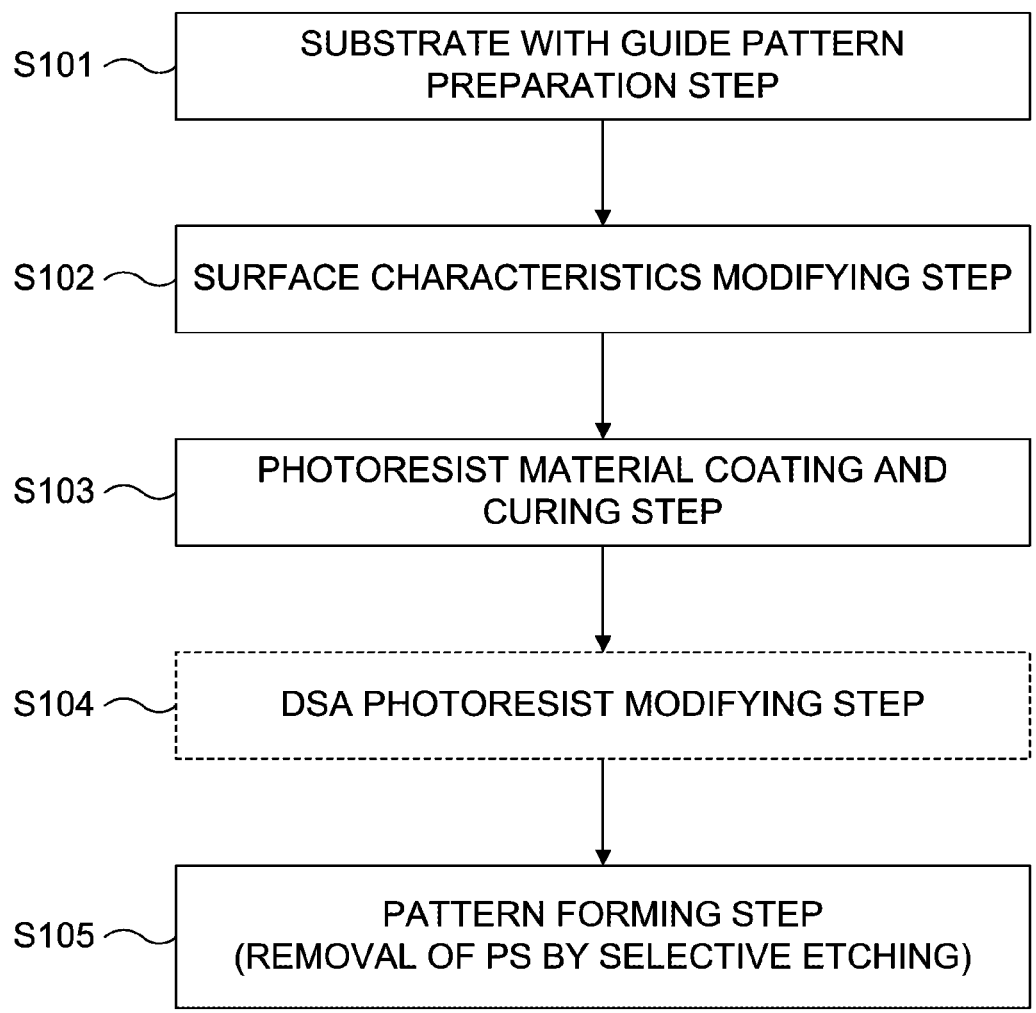
FIG. 1 is a flowchart illustrating an exemplary sequence of a patterning process by directed self-assembly lithography according to an embodiment.

The patterning process by DSA lithography is performed, for example, according to the sequence shown in FIG. 1.

<Preparation of Substrate with Guide Pattern S101>

Figure 2A:
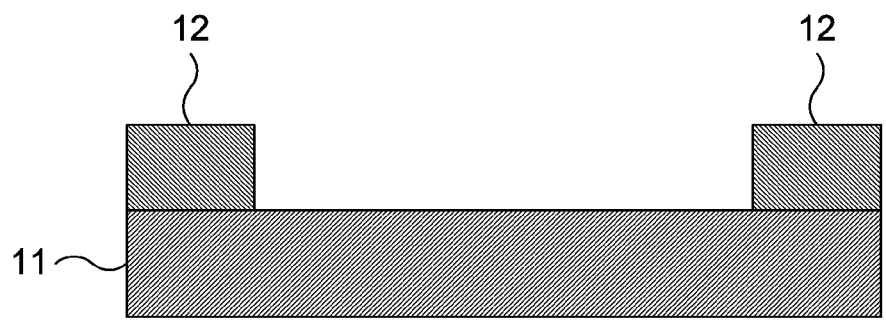
FIG. 2A through FIG. 2E schematically illustrate cross-sections according to the sequence shown in FIG. 1.

According to the patterning process by DSA lithography, a substrate with guide pattern is prepared first. As shown in FIG. 2A, a guide pattern 12 is formed on the surface of a substrate 11 such as a silicon wafer. The guide pattern 12 serves as a guide for forming a pattern such as line-and-space pattern and hole pattern. The guide pattern 12 may be formed by a known method of forming a photoresist pattern using chemically amplified photoresist material.

<Surface Characteristics Modifying Step S102>

Figure 2B:
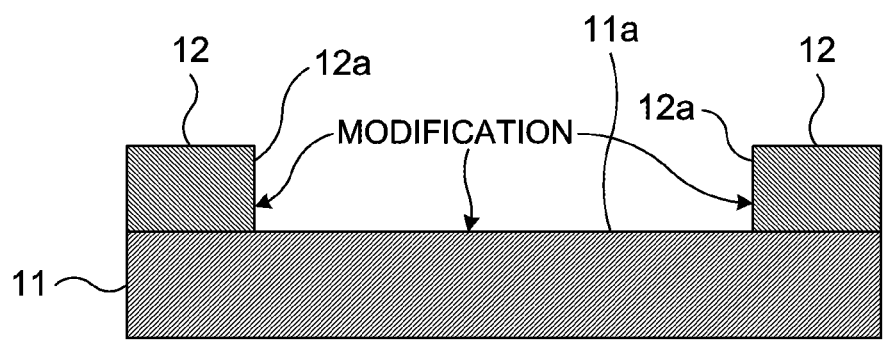

Once the substrate with guide pattern is ready, a surface characteristics modifying step S102 is performed as shown in FIG. 2B. The surface characteristics modifying step S102 is performed to modify the characteristics of an exposed surface 11a of the substrate 11 and side surfaces 12a of the guide pattern 12 of the substrate with guide pattern.

Figure 3A:
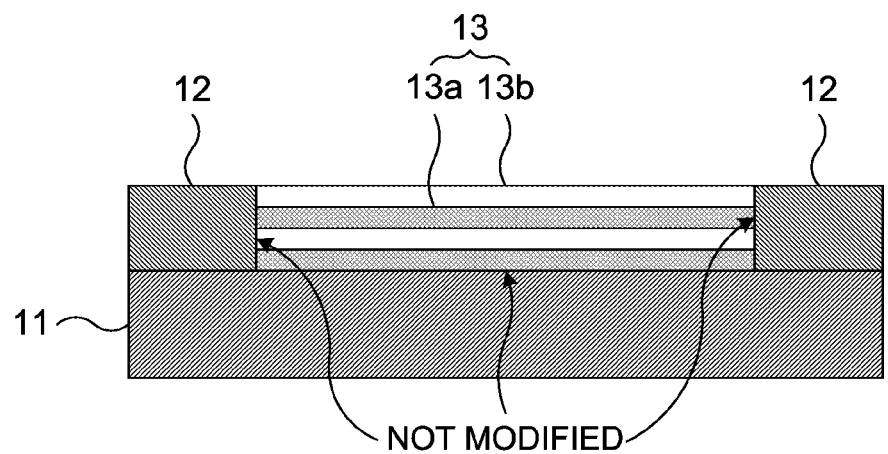
FIGS. 3A and 3B schematically illustrate DSA photoresist materials formed with and without modification.
Figure 3B:
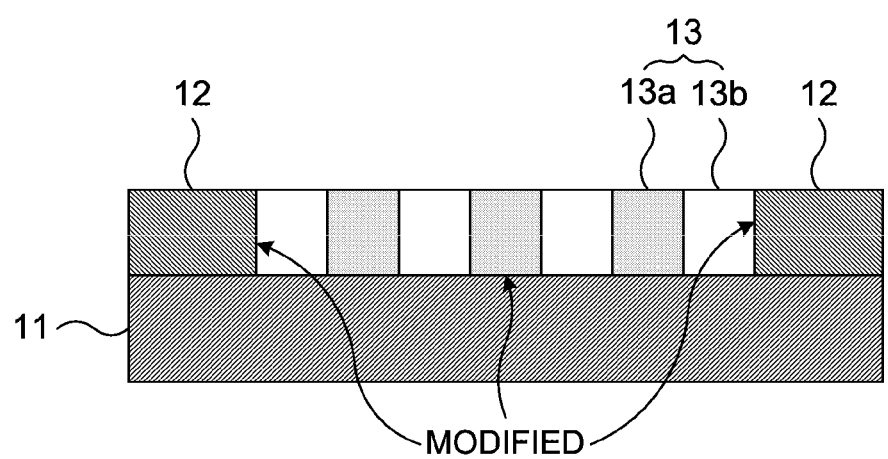

The surface characteristics modifying step S102 is performed to modify the characteristics of the exposed surface such that a DSA photoresist material 13 is arranged in a predetermined manner along the guide pattern 12 in the subsequent step. Specifically, when the surface characteristics modifying step S102 is not performed, the DSA photoresist material 13 including two or more organic materials 13a and 13b are formed as shown in FIG. 3A, which is not desired. Contrarily, when the surface characteristics modifying step S102 is performed, the wettability of the exposed surface 11a of the substrate 11 differentiates from that of the side surfaces 12a of the guide pattern 12, and the DSA photoresist material 13 including two or more organic materials 13a and 13b are formed as shown in FIG. 3B in step S103.

The detailed description of the surface characteristics modifying step S102 will be described later.

<DSA Photoresist Material Coating and Curing Step S103>

Figure 2C:
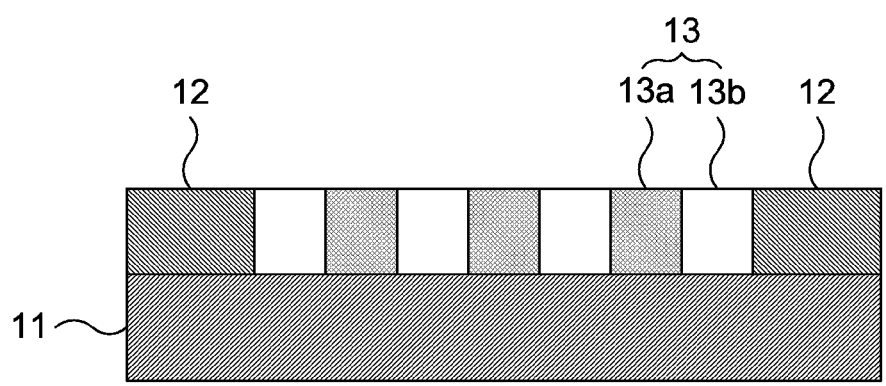

After the substrate 11 and the guide pattern 12 are subjected to the surface characteristics modifying step S102, the DSA photoresist material 13 is formed on the exposed surface 11a of the substrate 11 and the side surfaces 12a of the guide pattern 12 as shown in FIG. 2C.

The DSA photoresist material 13 is a block copolymer in which two or more different organic materials 13a and 13b (polymer blocks) are copolymerized. Since the organic materials 13a and 13b have a structure unlikely to dissolve, the organic materials 13a and 13b are thermally treated to form a microphase separation structure. A representative example of the DSA photoresist material 13 is a combination of two polymers having different molecular weights. For example, polymethyl methacrylate (PMMA) may be used as the organic material 13a, and polystyrene-polymethyl methacrylate (PS-PMMA), which is a diblock copolymer containing polystyrene (PS), may be used as the organic material 13b. The material that may be used as the DSA photoresist material 13 is not particularly limited as long as the phase separation structure is generated by self-assembly. As the DSA photoresist material 13, a block copolymer may be preferably used, and a block copolymer composed of a styrene unit-methacrylic acid ester unit may be used. More preferably, a diblock copolymer containing styrene unit-methyl methacrylate unit may be used. The method of applying the DSA photoresist material 13 is not particularly limited. In order to apply the DSA photoresist material 13, for example, a spin coating method may be used.

After the DSA photoresist material 13 is applied, the DSA photoresist material 13 is cured by performing a drying treatment and a baking treatment for a predetermined time duration. The baking treatment is not particularly limited. For example, the substrate with guide pattern having the DSA photoresist material 13 coated thereon may be subjected to the baking treatment at a temperature of about 80 to 400° C. for about 10 to 120 minutes using an oven and a hot plate.

The DSA photoresist material 13 is phase-separated into the organic material 13a such PMMA and the organic material 13b such as PS by above-described process, and the organic materials 13a and 13b are cured in an arranged state shown in FIG. 2C.

<DSA Photoresist Modifying Step S104>

Figure 2D:
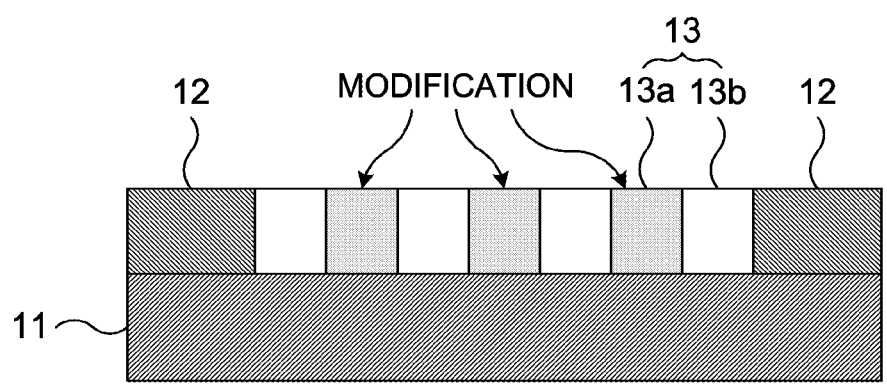

After the DSA photoresist material 13 is cured, a DSA photoresist modifying step S104 is performed to modify the organic material 13a, for example, modify PMMA into aluminum oxide ($Al_2O_3$), if necessary, as shown in FIG. 2D. By modifying the organic material 13a such as PMMA into $Al_2O_3$, the etch selectivity the organic materials 13a to the organic materials 13b may be improved. The modifying step S104 may be performed by alternately supplying trimethyl aluminum (TMA) gas and oxidizing gas such as water ($H_2O$) and hydrogen peroxide ($H_2O_2$). The modifying step S104 is optional and may be omitted.

<Pattern Forming Step S105>

Figure 2E:
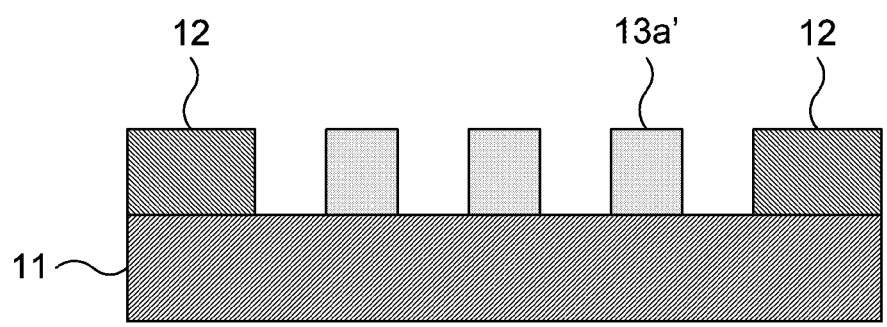

Next, using the difference in etching rate between the organic materials 13a and 13b phase-separated by self-assembly, the organic materials 13b of the cured DSA photoresist material 13 is removed by etching as shown in FIG. 2E. At this time, a portion of the guide pattern 12 may be removed along with the organic materials 13b. The etching process may include reactive ion etching (RIE) such as chemical dry etching and chemical wet etching and physical etching such as ion beam etching.

By performing the pattern forming step S105, an organic material pattern 13a' remains is formed on the substrate 11. The organic material pattern 13a' is transcribed to the substrate 11 by subjecting the substrate 11 to an etching process using the organic material pattern 13a' as a mask. As a result, a pattern (not shown) such as a line-and-space pattern and a hole pattern may be formed on the substrate 11.

(2) Configuration of Substrate Processing Apparatus

Next, a substrate processing apparatus according to the embodiment will be described. The substrate processing apparatus described herein is preferably used for performing the surface characteristics modifying step S102 of the above-described pattering process.

<Process Vessel>

Figure 4:
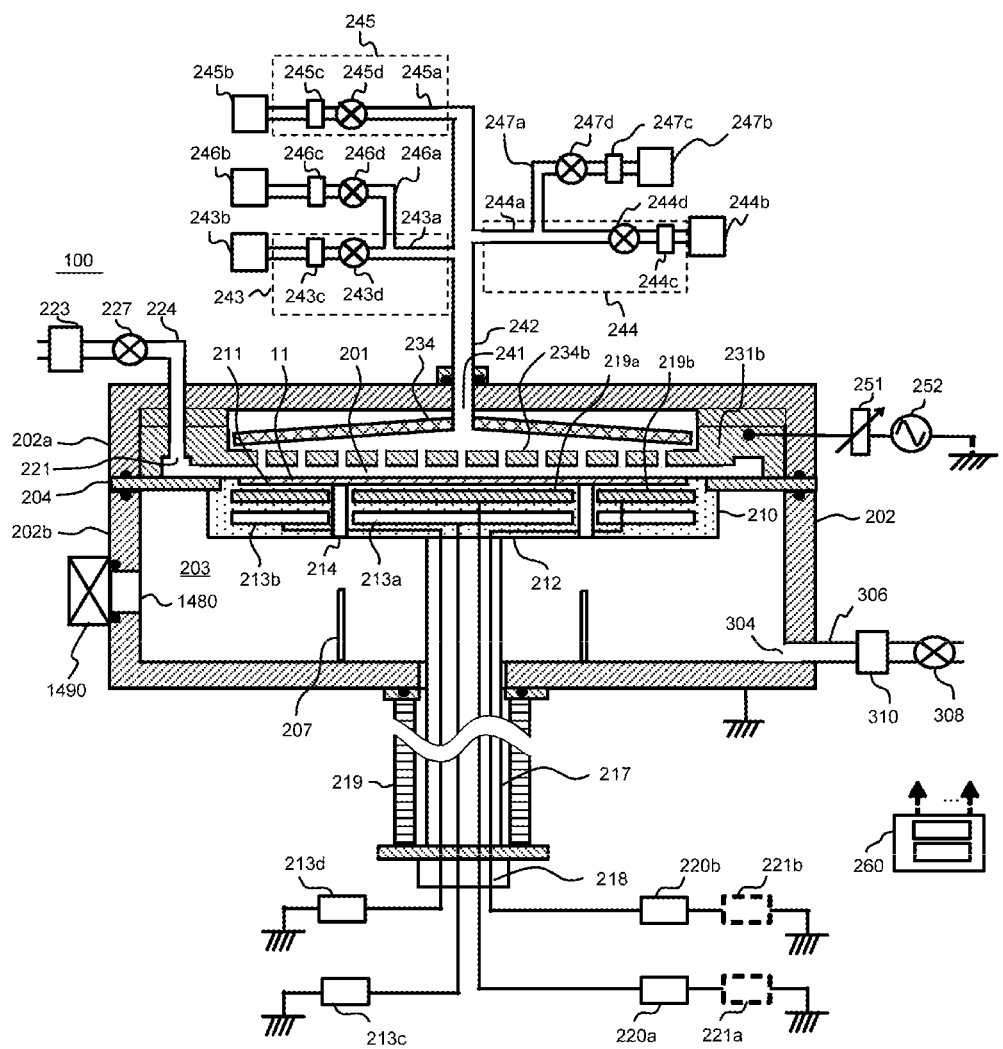
FIG. 4 schematically illustrates a vertical cross-section a substrate processing apparatus according to an embodiment.

As shown in FIG. 4, the substrate processing apparatus 100 includes a process vessel 202. For example, the process vessel 202 is a flat and sealed vessel having a circular horizontal cross-section. The process vessel 202 is made of a metal material such as aluminum (Al) and stainless steel (SUS) or quartz. The process vessel 202 includes an upper vessel 202a and a lower vessel 202b. A partition plate 204 is provided between the upper vessel 202a and the lower vessel 202b. A space above the partition plate 204 surrounded by the upper vessel 202a is referred to as a processing space (also referred to as a process chamber) 201 wherein the substrate 11 with the guide pattern 12 is subjected to the surface characteristics modifying step S102. A space under the partition plate 204 surrounded by the lower vessel 202b is referred to as the transfer space (also referred to as a transfer chamber) 203 wherein the substrate 11 is transferred. A substrate loading/unloading port 1480 is provided on a side surface of the lower vessel 202b adjacent to a gate valve 1490. The substrate 11 is moved between a vacuum transfer chamber (not shown) and the transfer chamber 203 through the substrate loading/unloading port 1480. Lift pins 207 are provided at the bottom of the lower vessel 202b. The lower vessel 202b is electrically grounded.

<Substrate Support Unit>

A substrate support unit (susceptor) 210 is provided in the process chamber 201 to support the substrate 11. The susceptor 210 includes: a substrate support 212 having a substrate placing surface 211 on which the substrate 11 is placed; temperature adjusting units 213a and 213b embedded in the substrate support 212 and configured to adjust temperature of the substrate 11 placed on the substrate placing surface 211; and bias electrodes 219a and 219b embedded in the substrate support 212 and configured to apply bias voltage to the substrate 11. Through-holes 214 penetrated by the lift pins 207 are provided in the substrate support 212 at positions corresponding to the lift pins 207.

The temperature adjusting units 213a and 213b embedded in the substrate support 212 are configured to maintain the substrate 11 placed on the substrate placing surface 211 at a predetermined temperature by heating or cooling using a thermal medium. The thermal medium may include, for example, ethylene glycol and a fluorine-based thermal medium may be used. The temperature adjusting units 213a and 213b may be individually provided in each region when the substrate placing surface 211 is divided into a plurality of regions such as a center region and a peripheral region. Flow rate adjusting units 213c and 213d configured to adjust the flow rate of the thermal medium are connected to the temperature adjusting units 213a and 213b, respectively. The flow rate adjusting units 213c and 213d are independently controlled according to an instruction from a controller 260 described later such that the temperature adjusting units 213a and 213b independently control the temperature of the substrate 11 on the substrate placing surface 211 for each region of the substrate 11 (zone control).

The bias electrodes 219a and 219b embedded in the substrate support 212 are provided in plurality of regions such as the center region and the peripheral region of the substrate placing surface 211, respectively similar to the temperature adjusting units 213a and 213b. Impedance adjusting units 220a and 220b and power supplies 221a and 221b for adjusting the bias voltages applied to the bias electrodes 219a and 219b are connected to the bias electrodes 219a and 219b, respectively. The impedance adjusting units 220a and 220b are independently controlled (zone control) according to an instruction from the controller 260 to individually adjust the bias voltage applied to the process chamber 201 through the bias electrodes 219a and 219b.

The substrate support 212 is supported by a shaft 217. The shaft 217 penetrates the bottom of the process vessel 202 and is connected to an elevating mechanism 218 at the outside of the process vessel 202. The substrate support 212 may be elevated and lowered by the elevating mechanism 218. A bellows 219 covers the lower portion of the shaft 217 to maintain the inside of the process chamber 201 airtight.

When the substrate 11 is transported, the substrate support 212 is lowered until the substrate placing surface 211 of the substrate support 212 is at a height of the substrate loading/unloading port 1480 (hereinafter referred to as "substrate transfer position"). When the substrate 11 is processed, the substrate support 212 is elevated until the substrate 11 reaches a processing position in the process chamber 201 (hereinafter referred to as "substrate processing position"). Specifically, when the substrate support 212 is lowered to the substrate transfer position, the upper ends of the lift pins 207 protrude from the upper surface of the substrate placing surface 211, and the lift pins 207 supports the substrate 11 from thereunder. When the substrate support 212 is elevated to the substrate processing position, the lift pins 207 are retracted from the upper surface of the substrate placing surface 211 and the substrate placing surface 211 supports the substrate 11 from thereunder. Preferably, the lift pins 207 are made of a material such as quartz and alumina since the lift pins 207 are in direct contact with the substrate 11.

<Gas Introduction Port>

A gas introduction port 241 for supplying various gases into the process chamber 201 is installed at the upper portion of the process chamber 201. A detailed configuration of each gas supply unit connected to the gas introduction port 241 will be described later.

A shower head 234, which includes a dispersion plate 234b configured to evenly disperse the gas supplied through the gas introduction port 241 into the process chamber 201, may be provided in the process chamber 201 that is spatially in communication with the gas introduction port 241.

A matching unit 251 and a high frequency power supply 252 are connected to a support member 231b of the dispersion plate 234b and are configured to supply electromagnetic waves (high frequency power or microwave). The gas supplied into the process chamber 201 through the dispersion plate 234b may be excited into plasma by the electromagnetic waves. That is, the dispersion plate 234b, the support member 231b, the matching unit 251 and the high frequency power supply 252 serve as a part of the first gas supply unit and part of the second gas supply unit (details of which will be described later) and are used to convert the first process gas and the second process gas described later into plasma.

<Gas Supply Unit>

A common gas supply pipe 242 is connected to the gas introduction port 241. A first gas supply pipe 243a, a second gas supply pipe 244a and a third gas supply pipe 245a are connected to the common gas supply pipe 24. A first process gas, which will be described later, is supplied by a first gas supply unit 243 which includes the first gas supply pipe 243a. A second process gas, which will be described later, is supplied by a second gas supply unit 244 including the second gas supply pipe 244a. A purge gas, which will be described later, is supplied by a third gas supply unit 245 including the third gas supply pipe 245a.

<First Gas Supply Unit>

A first gas supply source 243b, a mass flow controller (MFC) 243c serving as a flow rate controller (flow rate control unit) and a valve 243d serving as an opening/closing valve are installed at the first gas supply pipe 243a in order from an upstream side to a downstream side of the first gas supply pipe 243a. A gas containing a first element (the first process gas) from the first gas supply source 243b is supplied into the process chamber 201 via the MFC 243c and the valve 243d provided in the first gas supply pipe 243a and the common gas supply pipe 242.

The first process gas, for example, includes a hydrogen-containing gas. Specifically, gases such as hydrogen ($H_2$) gas and ammonia ($NH_3$) gas may be used as the first process gas.

The downstream end of a first inert gas supply pipe 246a is connected to the first gas supply pipe 243a at the downstream side of the valve 243d. An inert gas supply source 246b, a mass flow controller (MFC) 246c and a valve 246d are installed at the first inert gas supply pipe 246a in order from the upstream side to the downstream side of the first inert gas supply pipe 246a. An inert gas from the inert gas supply source 246b is supplied to the first gas supply pipe 243a via the MFC 246c and the valve 246d provided in the first inert gas supply pipe 246a. The inert gas may include, for example, nitrogen ($N_2$) gas. Instead of $N_2$ gas, rare gases such as helium (He) gas, neon (Ne) gas and argon (Ar) gas may be used as the inert gas.

The first gas supply unit (also referred to as a hydrogen-containing gas supply unit) 243 may include the first gas supply pipe 243a, the MFC 243c and the valve 243d. The first gas supply unit 243 may further include the first gas supply source 243b. A first inert gas supply unit may include the first inert gas supply pipe 246a, the MFC 246c and the valve 246d. The first inert gas supply unit may further include the inert gas supply source 246b and the first gas supply pipe 243a. The first gas supply unit 243 may further include the first inert gas supply unit.

<Second Gas Supply Unit>

A second gas supply source 244b, a mass flow controller (MFC) 244c and a valve 244d are installed at the second gas supply pipe 244a in order from an upstream side to a downstream side of the second gas supply pipe 244a. A gas containing a second element (the second process gas) from the second gas supply source 244b is supplied into the process chamber 201 via the MFC 244c and the valve 244d provided in the second gas supply pipe 244a and the common gas supply pipe 242.

The second process gas, for example, includes a second element different from the first element (for example, the hydrogen). The second element may include fluorine. The second process gas may include a fluorine-containing gas. Specifically, the second first process gas includes fluorine ($F_2$) gas, nitrogen fluoride ($NF_3$) gas and carbon fluoride gas such as $CF_4$, $C_2F_6$ and $C_3F_8$.

The downstream end of a second inert gas supply pipe 247a is connected to the second gas supply pipe 244a at the downstream side of the valve 244d. An inert gas supply source 247b, a mass flow controller (MFC) 247c and a valve 247d are installed at the second inert gas supply pipe 247a in order from the upstream side to the downstream side of the second inert gas supply pipe 247a. An inert gas from the inert gas supply source 247b is supplied to the second gas supply pipe 244a via the MFC 247c and the valve 247d provided in the second inert gas supply pipe 247a. The inert gas through the second inert gas supply pipe 247a may include, for example, nitrogen (N$_2$) gas. Instead of N$_2$ gas, rare gases such as helium (He) gas, neon (Ne) gas and argon (Ar) gas may be used as the inert gas.

The second gas supply unit (also referred to as a fluorine-containing gas supply unit) 244 may include the second gas supply pipe 244a, the MFC 244c and the valve 244d. The second gas supply unit 244 may further include the second gas supply source 244b. A second inert gas supply unit may include the second inert gas supply pipe 247a, the MFC 247c and the valve 247d. The second inert gas supply unit may further include the inert gas supply source 247b and the second gas supply pipe 244a. The second gas supply unit 244 may further include the second inert gas supply unit.

<Third Gas Supply Unit>

A third gas supply source 245b, a mass flow controller (MFC) 245c and a valve 245d are installed at the third gas supply pipe 245a in order from an upstream side to a downstream side of the third gas supply pipe 245a. An inert gas serving as the purge gas from the third gas supply source 245b is supplied into the process chamber 201 via the MFC 245c and the valve 245d provided in the third gas supply pipe 245a and the common gas supply pipe 242.

The inert gas supplied through the third gas supply pipe 245a may include, for example, nitrogen (N$_2$) gas. Instead of N$_2$ gas, rare gases such as helium (He) gas, neon (Ne) gas and argon (Ar) gas may be used as the inert gas.

The third gas supply unit (also referred to as a purge gas supply unit) 245 may include the third gas supply pipe 245a, the MFC 245c and the valve 245d. The third gas supply unit 245 may further include the third gas supply source 245b.

Preferably, the MFCs 243c, 246c, 244c, 247c and 245c included in the above-described gas supply units may be implemented by a flow rate control device such as a needle valve and an orifice highly responsive to gas flow. For example, although a conventional MFC may not be responsive when a width of a gas pulse is on the order of milliseconds, the flow rate control device such as the needle valve and the orifice may be responsive to the gas pulse of a millisecond or less by adding a high-speed ON/OFF valve.

<Exhaust System>

An exhaust port 221, which is a part of a first exhaust unit for exhausting an inner atmosphere of the process chamber 201, is connected to the surface of the inner wall of the process chamber 201 (the upper vessel 202a). An exhaust pipe 224, which is a first exhaust pipe, is connected to the exhaust port 221. A pressure controller 227 such as an APC (Automatic Pressure Controller) that controls the inner pressure of the process chamber 201 and a vacuum pump 223 are connected in-line to the exhaust pipe 224 in order. The first exhaust unit (exhaust line) may include the exhaust port 221, the exhaust pipe 224 and the pressure controller 227. The first exhaust unit may further include the vacuum pump 223.

A transfer chamber exhaust port 304, which is a part of a second exhaust unit for exhausting an inner atmosphere of the transfer chamber 203, is connected to a lower portion of the side wall of the transfer chamber 203. An exhaust pipe 306, which is a second exhaust pipe, is connected to the transfer chamber exhaust port 304. A valve 308, a pressure controller 310 such as an APC (Automatic Pressure Controller) that controls the inner pressure of the transfer chamber 203 and a vacuum pump (not shown) are connected in-line to the exhaust pipe 306 in order. The second exhaust unit (exhaust line) includes the transfer chamber exhaust port 304, the valve 308, the exhaust pipe 306 and the pressure controller 310. The second exhaust unit may further include the vacuum pump (not shown).

<Control Unit>

The substrate processing apparatus 100 includes a controller 260, which is a control unit (control means), configured to control components thereof.

Figure 5:
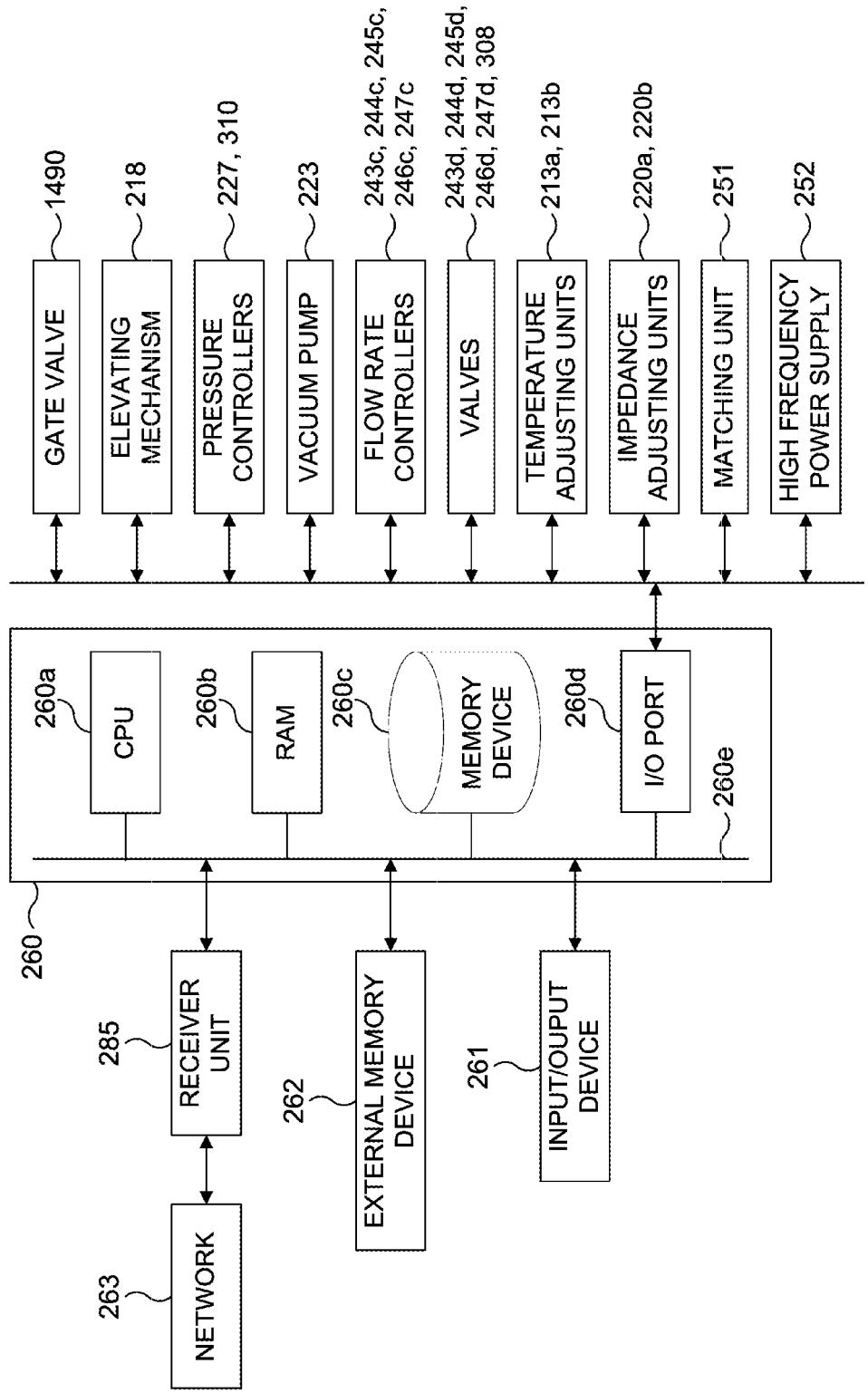
FIG. 5 schematically illustrates a configuration of a controller and components controlled by the controller of the substrate processing apparatus according to the embodiment.

As illustrated in FIG. 5, the controller 260 may be embodied by a computer having a CPU (Central Processing Unit) 260a, a RAM (Random Access Memory) 260b, a memory device 260c and an I/O port 260d. The RAM 260b, the memory device 260c and the I/O port 260d may exchange data with the CPU 260a via an internal bus 260e. An input/output device 261 such as a touch panel and an external memory device 262 may be connected to the controller 260.

The memory device 260c may be embodied by components such as flash memory and HDD (Hard Disk Drive). A control program for controlling the operation of the substrate processing apparatus 100; a process recipe in which information such as the order and condition of the substrate processing which will be described later is stored; and calculation data and processing data generated during the processing of the substrate 11 are readably stored in the memory device 260c. The process recipe is a program that is executed in the controller 260 to obtain a predetermined result by performing sequences of the substrate processing. Hereinafter, the process recipe and the control program are collectively referred to simply as a program. The term "program" may refer to only the process recipe, only the control program, or both. The RAM 260b is a work area in which the program or the data such as the calculation data and the processing data read by the CPU 260a are temporarily stored.

The I/O port 260d is connected to the components such as the gate valve 1490, the elevating mechanism 218, the flow rate adjusting units 213c and 213d, the impedance adjusting units 220a and 220b, the matching unit 251, the high frequency power supply 252, the MFCs 243c, 244c, 245c, 246c and 247c, the valves 243d, 244d, 245d, 246d, 247d and 308, the pressure controllers 227 and 310, and the vacuum pump 223.

The CPU 260a serving as the arithmetic unit is configured to read and execute the control program stored in the memory device 260c, and read the process recipe in accordance with an instruction such as an operation command inputted from the input/output device 261. The CPU 260a may compute the calculation data by comparing a value inputted from the receiver unit 285 with the process recipe or control data stored in the memory device 260c. The CPU 260a may select the process recipe based on the calculation data. The CPU 260a may be configured to control operation of the substrate processing apparatus 100 according to the process recipe. For example, the CPU 260a may be configured to perform operation such as the opening and closing operations of the gate valve 1490, the operation of the elevating mechanism 218, the operations of the flow rate adjusting units 213c and 213d, the voltage adjusting operations of the impedance adjusting units 220a and 220b, the power matching operation of the matching unit 251, the operation of the high frequency power supply 252, the operations of the MFCs 243c, 244c, 245c, 246c and 247c, the opening and closing operations of the valves 243d, 244d, 245d, 246d, 247d and 308, the pressure adjusting operations of the pressure controllers 227 and 238, and the operation of the vacuum pump 223.

The controller 260 may be embodied by a dedicated computer or a general purpose computer. The controller 260 of the embodiment may be embodied by preparing the external memory device 262 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 262. The method of providing the program to the computer is not limited to the external memory device 262. The program may be directly provided to the computer using a communication means such as a network 263 (Internet or dedicated line) without the external memory device 262. The memory device 260c or the external memory device 262 may be embodied by a computer-readable recording medium. Hereinafter, the memory device 260c or the external memory device 262 may be collectively referred to as recording medium. Hereinafter, the term "recording medium" may refer to only the s memory device 260c, only the external memory device 262, or both.

(3) Substrate Processing

Figure 6:
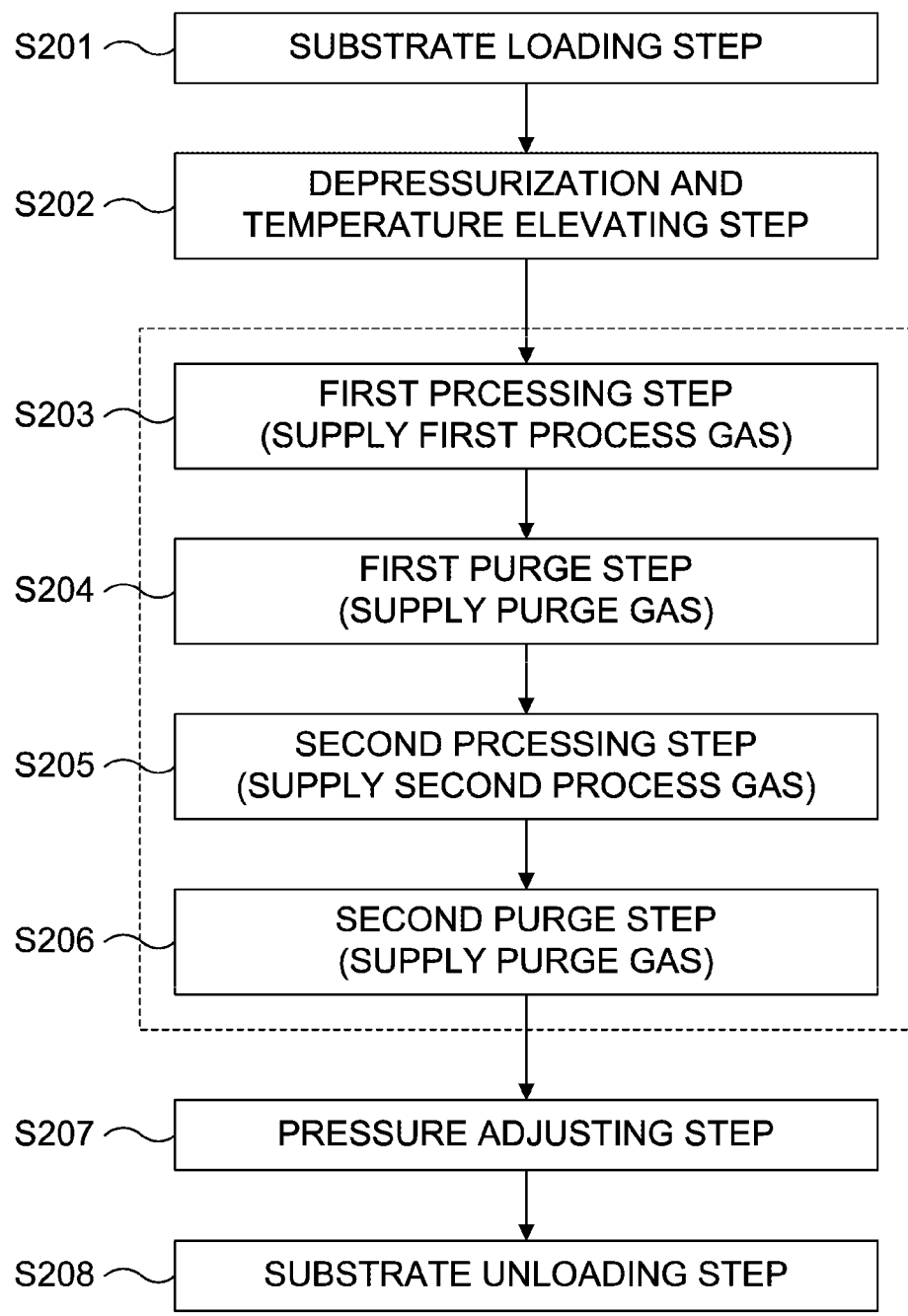
FIG. 6 is a flowchart illustrating an exemplary sequence of a surface characteristics modifying step of a substrate processing according to the embodiment.
Figure 7:
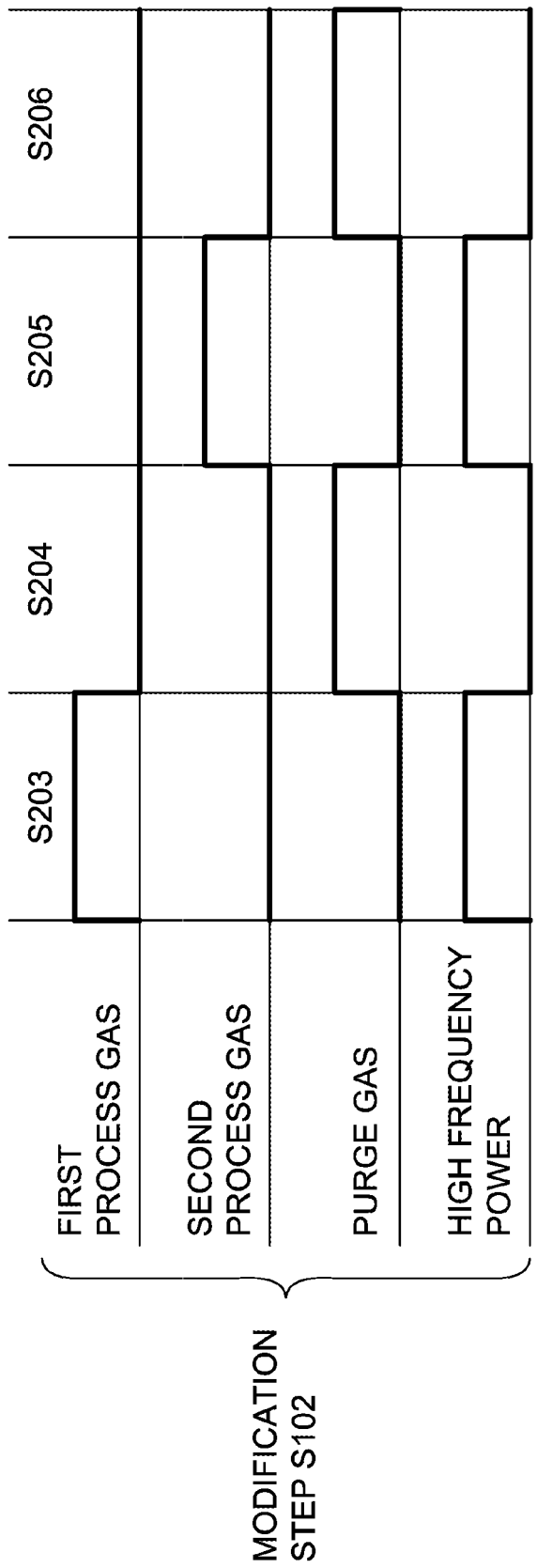
FIG. 7 illustrates an exemplary sequence of the surface characteristics modifying step of the substrate processing according to the embodiment.

Next, a manufacturing process of a semiconductor device using the above-described substrate processing apparatus 100 will be described by way of an exemplary sequence of the surface characteristics modifying step S102 of the patterning process by DSA with reference to FIGS. 6 and 7. In the following description, the operations the components constituting the substrate processing apparatus 100 are controlled by the controller 260.

Hereinafter, the term "substrate" refers to "substrate itself" or "stacked structure of substrate and layer or film formed on the surface thereof" (collectively to "the substrate and the layer or the film formed on the surface thereof"). "Surface of substrate" may be refers to "surface of substrate itself" or "surface of layer or film formed on the surface of substrate" (i.e. "top surface of the stacked structure"). Thus, in the specification, "supplying a predetermined gas to a substrate" refers to "directly supplying a predetermined gas to a surface (exposed surface) of the substrate itself" or "supplying a predetermined gas to a layer or film formed on a substrate" (i.e. "supplying a predetermined gas to the top surface of the stacked structure"). The term "wafer" is used in the same sense as "substrate" in the specification, and the term "substrate" may be replaced by "wafer."

The surface characteristics modifying step S102 according to the embodiment will be described hereinafter.

<Substrate Loading Step S201>

In the surface characteristics modifying step S102, the substrate 11 to be processed is loaded into the process chamber 201 of the substrate processing apparatus 100. Specifically, the substrate support 212 is lowered by the elevating mechanism 218, the lift pins 207 protrude from the upper surface of the substrate support 212 through the through-holes 214. After the inner pressure of the process chamber 201 is adjusted to a predetermined pressure, the gate valve 1490 is opened. The substrate 11 is transferred through the gate valve 1490 and placed on the lift pins 207. After the substrate 11 is placed on lift pins 207, the substrate support 212 is elevated by the elevating mechanism 218 to transfer the substrate 11 to the substrate placing surface 211 and then further elevated until the substrate 11 is at a processing position (substrate processing position) in the process chamber 201.

<Depressurization and Temperature Elevating Step (S202)>

Next, the process chamber 201 is exhausted through the exhaust pipe 224 of the process chamber 201 until the inner pressure of the process chamber 201 reaches a predetermined level (vacuum level). At this time, the opening degree of the pressure controller 227, which is an APC valve, is feedback-controlled based on the pressure measured by a pressure sensor (not shown). It is preferable that the process chamber 201 is exhausted to a vacuum level that may be reached by a single exhaust. The flow rate adjusting units 213c and 213d is configured to control the flow rate of the thermal medium supplied to the temperature adjusting units 213a and 213b based on a temperature detected by a temperature sensor (not shown) such that the temperature of the substrate 11 placed on the substrate placing surface 211 reaches a predetermined temperature. For example, the predetermined temperature of the substrate 11 may range from room temperature (RT) to 150° C., preferably from room temperature to 100° C. When the predetermined temperature is lower than room temperature, a condensation may occur, and the predetermined temperature exceeds 150° C., the photoresist material of the guide pattern 12 may deteriorate. When gas from members or moisture is present in the process chamber 201, the gas or the moisture may be removed by vacuum-exhaust or purged with $N_2$ gas. After the inner atmosphere of process chamber 201 is stabilized, a first processing step S203 is performed.

<First Processing Step S203>

In the first processing step S203, the hydrogen-containing gas, which is the first process gas, is supplied into the process chamber 201 by the first gas supply unit 243. The hydrogen-containing gas may include $H_2$ gas and $NH_3$ gas. Hereinafter, the first processing step S203 will be described under an assumption that the hydrogen-containing gas is $H_2$ gas. Specifically, the hydrogen-containing gas from the first gas supply source 243b having the flow rate thereof adjusted to a predetermined flow rate by the MFC 243c is supplied into the process chamber 201 by opening the valve 243d. The predetermined flow rate may range from 100 sccm to 10000 sccm. The hydrogen-containing gas having the flow rate thereof adjusted is then supplied into the process chamber 201 through the dispersion plate 234b of the shower head 234. The exhaust system continuously exhausts the process chamber 201 such that the inner pressure of process chamber 201 is maintained at a first inner pressure. At this time, the hydrogen-containing gas is supplied into the process chamber 201 at a predetermined pressure (first pressure ranging from 100 Pa to 20000 Pa for example).

In the first processing step S203, the high frequency power is supplied into the process chamber 201 through the dispersion plate 234b by the matching unit 251 and the high frequency power supply 252. The $H_2$ gas is excited into plasma state while passing through the dispersion plate 234b, and hydrogen plasma is generated in the process chamber 201. At this time, since the plasma is likely to be generated in the peripheral region of the substrate 11, the temperature of the peripheral region of the substrate 11 may be elevated to be higher than that of the center region of the substrate 11. In this case, zone control is performed to individually adjust the thermal medium supplied to the temperature adjusting units 213a and 213b by the flow rate adjusting units 213c and 213d to appropriately adjust the difference in the temperature distribution of the peripheral region and the center region of the substrate 11.

Hydrogen plasma increases the hydrophilicity of the surface 11a of the substrate 11 and the side surface 12a of the guide pattern 12 constituting the substrate with guide pattern. That is, at least the surface 11a of the substrate 11 and the side surface 12a of the guide pattern 12 are hydrophilized by hydrogen plasma generated in the process chamber 201 in the first processing step S203.

The characteristic of the surface of the substrate 11 is modified to increase the hydrophilicity of the substrate with guide pattern by supplying the hydrogen plasma to the substrate 11 in the process chamber 201 in the first processing step S203. The modifying process, namely hydrophilization treatment, may be performed to increases the hydrophilicity under predetermined conditions such as a predetermined inner pressure of the process chamber 201, a predetermined flow rate of the $H_2$ gas, a predetermined temperature of the substrate 11 and a predetermined high frequency power.

In the first processing step S203, it is preferable that the hydrophilization treatment is performed isotropically. When the hydrophilization treatment is performed isotropically, both of the surface 11a of the substrate 11 and the side surface 12a of the guide pattern 12 are affected by the isotropical hydrophilization treatment equally.

In order to perform the isotropical hydrophilization treatment, the first processing step S203 may be performed without applying a bias to the substrate 11. If the bias is not applied to the substrate 11, the moving direction of the hydrogen ions in the hydrogen plasma is not restricted such that the hydrogen ions may move isotropically. Specifically, the voltages applied to the bias electrodes 219a and 219b are adjusted by the impedance adjusting units 220a and 220b such that the bias electrodes 219a and 219b do not generate a bias. At this time, each of the impedance adjusting units 220a and 220b may perform zone control for each region in order to ensure uniformity at the surface of the substrate 11.

The inner pressure of the process chamber 201 in the first processing step S203 may be higher than that of the process chamber 201 in a second processing step S205 in order to perform the isotropical hydrophilization process. When the inner pressure of the process chamber 201 is high, the mean free path becomes relatively small, resulting in the scattering of the hydrogen ions in the hydrogen plasma. Specifically, the flow rate of the $H_2$ gas supplied by the first gas supply unit 243 is controlled and the inner pressure of the process chamber 201 is adjusted by the exhaust system such that the inner pressure of the process chamber 201 in the first processing step S203 is relatively higher than that of the process chamber 201 in the second processing step S205.

<First Purge Step S204>

After the first processing step S203 is performed, the supply of the $H_2$ gas by the first gas supply unit 243 and the supply of high frequency power by the matching unit 251 and the high frequency power supply 252 are stopped. A first purge step S204 is performed by exhausting the gas remaining in the process chamber 201 through the exhaust pipe 224.

In the first purge step S204, the $N_2$ gas serving as the purge gas is supplied into the process chamber 201 by the third gas supply unit 245 while exhausting the process chamber 201 through the exhaust pipe 224. The inert gas serving as the purge gas may include $N_2$ gas in the embodiment. Rare gases such as argon (Ar), helium (He), neon (Ne) and xenon (Xe) may be used as the purge gas instead of $N_2$ gas. Hereinafter, the first purge step S204 will be described under an assumption that the inert gas is $N_2$ gas. Specifically, the $N_2$ gas from the third gas supply source 245b having the flow rate thereof adjusted to a predetermined flow rate by the MFC 245c is supplied into the process chamber 201 by opening the valve 245d. Preferably, the flow rate of the $N_2$ gas adjusted by the MFC 245c may range from 100 sccm to 20000 sccm. The $N_2$ gas having the flow rate thereof adjusted is then supplied into the process chamber 201.

That is, the inert gas (for example, $N_2$ gas), which is a purge gas, is supplied during the first purge step S204 which is performed between the first processing step S203 and the second processing step S205. Thus, the first processing step S203 and the second processing step S205 are completely separated on the time axis by performing the first purge step S204 therebetween.

When the purge gas is supplied into the process chamber 201 in the first purge step S204, the chemical reaction between the $H_2$ gas supplied in the first processing step S203 and the $F_2$ gas supplied in the second processing step S205 is suppressed form occurring in the process chamber 201, thereby inhibiting the generation of hydrogen fluoride gas in the process chamber 201, which etches silicon (Si) and silicon oxide (SiO) used as the material of the substrate 11.

<Second Processing Step S205)>

After the first purge step S204 is performed, the supply of the $N_2$ gas by the third gas supply unit 245 is stopped and the second processing step S205 is then performed.

In the second processing step S205, the fluorine-containing gas, which is the second process gas, is supplied into the process chamber 201 by the second gas supply unit 244. The fluorine-containing gas may include $F_2$ gas. Hereinafter, the second processing step S205 will be described under an assumption that the fluorine-containing gas is $F_2$ gas. Specifically, the fluorine-containing gas from the second gas supply source 244b having the flow rate thereof adjusted to a predetermined flow rate by the MFC 244c is supplied into the process chamber 201 by opening the valve 244d. The predetermined flow rate may range from 100 sccm to 10000 sccm. The fluorine-containing gas having the flow rate thereof adjusted is then supplied into the process chamber 201 through the dispersion plate 234b of the shower head 234. The exhaust system continuously exhausts the process chamber 201 such that the inner pressure of process chamber 201 is maintained at a second inner pressure. Preferably, as described later, the second inner pressure of the second processing step S205 is lower than the first inner pressure of the first processing step S203. At this time, the fluorine-containing gas is supplied into the process chamber 201 under a predetermined pressure (second pressure ranging from 100 Pa to 20000 Pa, for example). The second pressure of the second processing step S205 is preferably lower than the first pressure of the first processing step S203.

In the second processing step S205, the high frequency power is applied to the process chamber 201 through the dispersion plate 234b by the matching unit 251 and the high frequency power supply 252. As a result, the $F_2$ gas passing through the dispersion plate 234b is converted into plasma, and the fluorine plasma is generated in the process chamber 201. Since the plasma is likely to be generated in the peripheral region of the substrate 11, the temperature of the peripheral region of the substrate 11 may be elevated to be higher than that of the center region of the substrate 11. In this case, zone control is performed to individually adjust the thermal medium supplied to the temperature adjusting units 213a and 213b by the flow rate adjusting units 213c and 213d to appropriately adjust the difference in the temperature distribution of the peripheral region and the center region of the substrate 11.

Fluorine plasma increased the hydrophobicity of the substrate 11. That is, the surface of the substrate 11 is hydrophobilized by fluorine plasma generated in the process chamber 201.

The characteristic of the surface of the substrate 11 is modified to increase the hydrophobicity of the substrate with guide pattern by supplying the fluorine plasma to the substrate 11 in the process chamber 201 in the second processing step S205. The modifying process, namely hydrophobilization treatment, may be performed to increases the hydrophobicity under predetermined conditions such as a predetermined inner pressure of the process chamber 201, a predetermined flow rate of the H2 gas, a predetermined temperature of the substrate 11 and a predetermined high frequency power.

In the second processing step S205, it is preferable that the surface of the substrate 11 is subjected to the hydrophobilization treatment after the hydrophilization treatment is performed. That is, the surface of the substrate 11 is first hydrophilized and then hydrophobilized by sequentially performing the hydrophilization treatment in the first processing step S203 and the hydrophobilization treatment in the second processing step S205. As a result, the characteristic of the surface of the substrate 11 is close to neutral wettability. That is, by sequentially performing the hydrophilization treatment and the hydrophobilization treatment, the wettability of the surface of the substrate 11 is neutralized.

The object of the surface characteristics modifying step S102 is to make the wettability of the surface 11a of the substrate 11 differ from the wettability of the side surface 12a of the guide pattern 12 such that the arrangement of the organic materials 13a and 13b of the DSA photoresist material 13 shown in FIG. 3B is facilitated. If the wettability of the entire surface including the surface 11a of the substrate 11 and the side surface 12a of the guide pattern 12 is neutralized, the object cannot be achieved.

Therefore, in the second processing step S205, it is preferable that the hydrophobilization treatment is performed anisotropically. The hydrophobilization treatment may be performed anisotropically such that the hydrophobilization treatment affects the surface 11a of the substrate 11 and the hydrophobilization treatment does not affect the side surface 12a of the guide pattern 12. As a result, the wettability of the surface 11a is differentiated from that of the side surface 12a. That is, the surface 11a of the substrate 11 is sequentially subjected to the hydrophilization treatment and the hydrophobilization treatment while maintaining the hydrophilicity of the side surface 12a of the guide pattern 12 such that the wettability of the surface 11a of the substrate 11 is neutralized.

In order to perform the hydrophobilization treatment anisotropically, the second processing step S205 may be performed with a bias applied to the substrate 11. When the bias is applied to the substrate 11, the amount of the fluorine ion in the fluorine plasma reaching the side surface 12a of the guide pattern 12 is controlled by the bias. Thus, the amount of the fluorine ion in the fluorine plasma reaching the side surface 12a of the guide pattern 12 is less than that of the fluorine ion in the fluorine plasma reaching the surface 11a of the substrate 11. As a result, the wettability the surface 11a is differentiated from that of the side surface 12a. Specifically, the voltage applied to the bias electrodes 219a and 219b is adjusted by the impedance adjusting units 220a and 220b such that the bias is generated by the bias electrodes 219a and 219b. Simultaneously, the impedance adjusting units 220a and 220b may perform zone control for each region in order to ensure uniformity on the surface of the substrate 11.

In order to perform the hydrophobilization treatment anisotropically, the second processing step S205 may be performed with the inner pressure of the process chamber 201 in the second processing step S205 being lower than that of the process chamber 201 in the first processing step S203. When the inner pressure of the process chamber 201 is low, the mean free path becomes relatively large such that the fluorine ion in the fluorine plasma is unlikely to scatter. As a result, the amount of the fluorine ion in the fluorine plasma reaching the side surface 12a of the guide pattern 12 is less than that of the fluorine ion in the fluorine plasma reaching the surface 11a of the substrate 11, and the wettability the surface 11a is differentiated from that of the side surface 12a. Specifically, by controlling the flow rate of the $F_2$ gas supplied by the second gas supply unit 244 and adjusting the amount of the inner atmosphere of the process chamber 201 exhausted by the exhaust system in the second processing step S205, the inner pressure of the process chamber 201 is adjusted to be relatively lower than that of the process chamber 201 in the first processing step S203.

After the second processing step S205 is performed, the supply of the $F_2$ gas by the second gas supply unit 244 and the supply of high frequency power by the matching unit 251 and the high frequency power supply 252 are stopped. A second purge step S206 is then performed by exhausting the gas remaining in the process chamber 201 through the exhaust pipe 224.

Since the second purge step S206 is the same as the first purge step S204, a detailed description thereof is omitted.

<Pressure Adjusting Step S207>

After the second purge step S206 is performed, the supply of the $N_2$ gas by the third gas supply unit 245 is stopped and a pressure adjusting step S207 is performed.

In the pressure adjusting step S207, the inner atmosphere of the process chamber 201 and the inner atmosphere of the transfer chamber 203 are exhausted through the exhaust pipe 224 and the exhaust pipe 306, respectively until the inner pressure of the process chamber 201 and the inner pressure of the transfer chamber 203 reach a predetermined pressure (vacuum level). The inner pressure of the process chamber 201 and the inner pressure of the transfer chamber 203 are adjusted such that the inner pressure of the process chamber 201 and the transfer chamber 203 are equal to or lower than the inner pressure of the vacuum transfer chamber (not shown) in communication with the process chamber 201 and the transfer chamber 203 via the substrate loading/unloading port 1480.

The substrate 11 may be supported by the lift pins 207 until the substrate 11 is cooled down to a predetermined temperature before, during or after the pressure adjusting step S207. When the substrate 11 is heated by plasma, the substrate 11 may be cooled by supplying the thermal medium to the temperature adjusting units 213a and 213b. When the substrate 11 is excessively cooled (lower than room temperature), the thermal medium may be supplied to the temperature adjusting units 213a and 213b to raise the temperature of the substrate 11 at least to room temperature.

<Substrate Unloading Step S208>

After the inner pressures of the process chamber 201 and the transfer chamber 203 are adjusted to a predetermined pressure in the pressure adjusting step S207, the gate valve 1490 is opened, and the substrate 11 is unloaded to the vacuum transfer chamber (not shown) from the transfer chamber 203 through the substrate loading/unloading port 1480.

By performing the steps S201 through S208, the surface characteristics modifying step S102 for the substrate 11 is completed.

(4) Photoresist Material Coating and Curing Step S103

Figure 8:
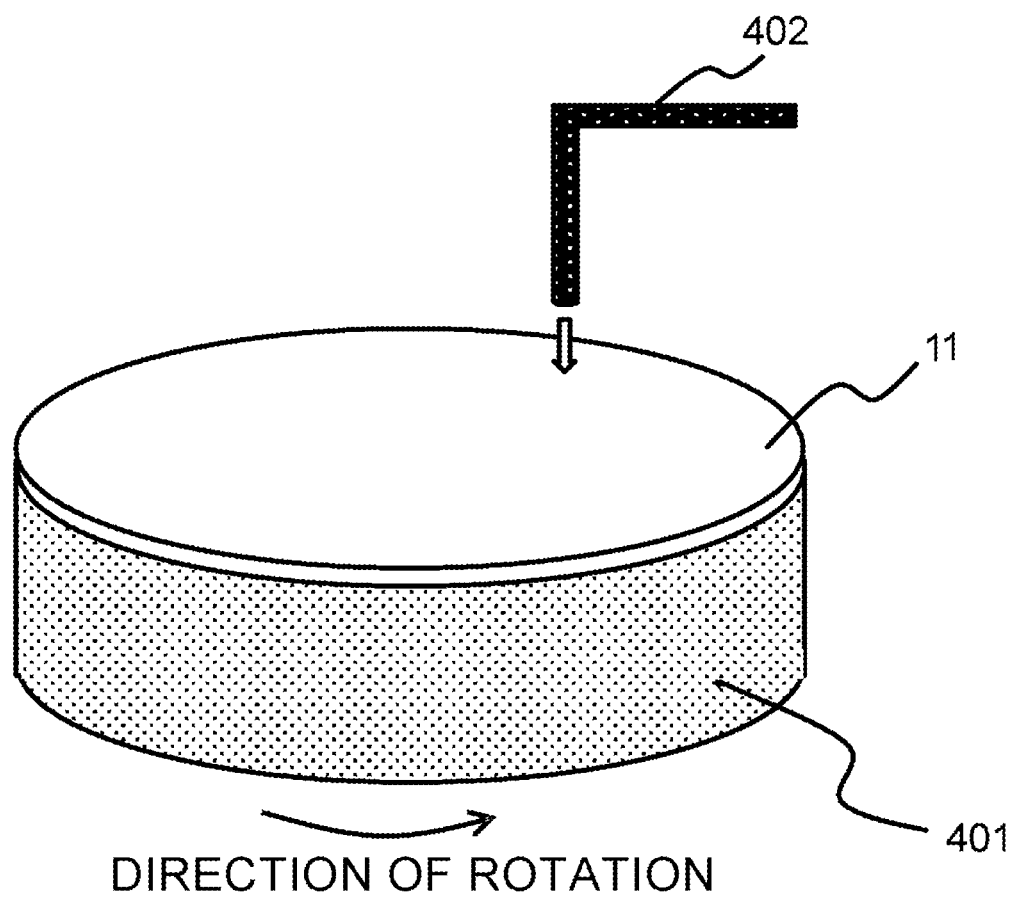
FIG. 8 schematically illustrates an apparatus used for coating and curing of a photoresist material of the substrate processing according to the embodiment.

Next, an exemplary sequence of the photoresist material coating and curing step S103 which is performed after the surface characteristics modifying step S102 will be described with reference to FIGS. 8 and 9. The photoresist material coating and curing step S103 is a part of the patterning process by DSA, which is one of semiconductor device manufacturing processes.

<Coating Apparatus>

The coating of the photoresist material in the step S103 is performed using a coating apparatus (not shown). The coating apparatus includes a process chamber (not shown) for accommodating the substrate 11 to be processed, a temperature adjustment mechanism (not shown) for adjusting the inner temperature of the process chamber, and a coating mechanism (not shown) for applying the photoresist material. The coating apparatus may be implemented using known techniques.

The coating mechanism of the coating apparatus is capable of applying the photoresist material by various methods. As a representative example, the coating mechanism may apply the photoresist material by spin coating. As shown in FIG. 8, the coating mechanism capable of spin coating includes a rotating table 401 configured to support and rotate the substrate 11, and a nozzle 402 configured to drop the photoresist material onto the surface of the substrate 11 placed on the rotating table 401.

<Processing Sequence>

Next, the sequence of the photoresist material coating and curing step S103 the performed using the coating apparatus described above will be described with reference to FIG. 9.

<Substrate Loading Step S301>

In the photoresist material coating and curing step S103, the substrate 11 subjected to the modifying process S102 is loaded into the process chamber of the coating apparatus and placed on the rotating table 401 of the coating mechanism. The substrate loading step S301 may further include a temperature adjustment step of adjusting the temperature of the substrate 11 on the turntable 401 to a predetermined temperature. When the inner temperature of the process chamber of the coating apparatus is stabilized, a coating step S302 is performed.

<Coating Step S302>

In the coating step S302, the substrate 11 placed on the turntable 401 is rotated by rotating the turntable 401. By applying the photoresist material through the dropping nozzle 402, the photoresist material is coated on the surface of the rotating substrate 11. The DSA photoresist material may be used as photoresist material. The DSA photoresist material is a block copolymer formed by copolymerizing two or more polymer blocks as described above. A representative example of the DSA photoresist material is PS-PMMA, which is a diblock copolymer. The DSA photoresist material is coated on the exposed surface 11a of the substrate 11 where the guide pattern 12 is not formed, i.e. the surface 11a which has been neutralized in the surface characteristics modifying step S102. The coating step S302 is complete when a predetermined amount of the DSA photoresist material is applied on the surface of the substrate 11 such that a coating of the DSA photoresist material having a desired thickness is formed on the surface of the substrate 11.

<Separation Step S303>

Polymer blocks (e.g., the organic materials 13a and 13b) constituting the DSA photoresist material applied on the surface of the substrate 11 are separated and arranged in a predetermined manner in a separation step S303. Specifically, after the coating step S302 is completed, the substrate 11 with the DSA photoresist material thereon is preserved for a predetermined time required for the polymer blocks to be arranged in the predetermined manner. The predetermined time is determined according to the type of the DSA photoresist material used. The substrate 11 may be heated at a temperature of about 80° C. to 400° C. for about 10 seconds to 120 minutes using an oven or a hot plate as described above.

<Drying Step S304>

After the separation step S303 is performed, a drying step S304 is performed. In the drying step S304, the DSA photoresist material applied on the surface of the substrate 11 is dried. Specifically, after the separation step S303 is completed, the substrate 11 with the DSA photoresist material thereon is preserved for a predetermined time required for the polymer blocks to be dried. The predetermined time is determined according to the type of the DSA photoresist material used.

<Baking Step S305>

After the drying step S304 is performed, a baking step S305 is performed. The DSA photoresist material applied on the surface of the substrate 11 is cured in the baking step S305. Specifically, after the drying step S304 is completed, the substrate 11 is heated at a temperature of about 80° C. to 400° C. for about 10 seconds to 120 minutes using an oven or a hot plate.

By subjecting the DSA photoresist material coated on the surface of the substrate 11 to the steps S302 through S305, the polymer blocks (e.g., the organic materials 13a and 13b) are phase-separated and arranged regularly as shown in FIG. 2C between the guide patterns 12.

<Substrate Unloading Step S306>

After the DSA photoresist material is cured, a substrate unloading step S306 is performed. The substrate 11 is unloaded from the process chamber of the coating apparatus in the substrate unloading step S306. In the substrate unloading step S306, conditions such as inner temperature and inner pressure of the process chamber may be adjusted. When the substrate 11 with the cured DSA photoresist material is cured is unloaded, the photoresist material coating and curing process S103 is complete. Thereafter, steps such as the DSA photoresist modifying step S104 and the pattern forming step S105 are performed.

(5) Effects of the Embodiment

According to the embodiment, one or more advantageous effects described below are provided.

(a) According to the embodiment, since the characteristics of the surface of the substrate 11 is modified in the surface characteristics modifying step S102, the DSA photoresist material 13 is regularly arranged between the guide pattern 12 in the photoresist material coating and curing step S103. That is, the wettability of the surface of the substrate 11 may be differentiated from that of the surface of the guide pattern 12 in the surface characteristics modifying step S102, thereby suppressing the laminated arrangement (shown in FIG. 3A) of the organic materials 13a and 13b constituting the DSA photoresist material 13 and facilitating the regular arrangement of the organic materials 13a, 13b along the guide pattern 12.

(b) According to the embodiment, the surface characteristics modifying step S102 includes the first processing step S203 for subjecting the substrate 11 to the hydrophilization treatment with the plasma of the hydrogen-containing gas and the second processing step S205 for subjecting the substrate 11 to the hydrophobilization treatment with the plasma of the fluorine-containing gas. By sequentially performing the physical hydrophilization treatment and the physical hydrophobilization treatment by ion irradiation to neutralize the wettability of the surface of the substrate 11, the wettability of the surface of the substrate 11 may be differentiated from that of the surface of the guide pattern 12. Therefore, the patterning process by DSA may be performed appropriately by arranging the polymer materials constituting the DSA photoresist material 13 in horizontal direction. By sequentially performing the hydrophilization treatment and the hydrophobilization treatment to obtain the difference in the wettabilities, additional steps such as forming a neutralization layer in advance is not necessary. Therefore, the patterning process by DSA may be efficiently and properly performed according to the embodiment.

(c) According to the embodiment, the DSA photoresist material containing two polymers having different molecular weights is used. The phase separation of the DSA photoresist material may be achieved in the photoresist material coating and curing step S103. Therefore, the embodiment is highly preferable as a next-generation lithography technique capable of coping with the highly integrated or downsized semiconductor device.

(d) According to the embodiment, the treatment is performed isotropically in the first processing step S203, and the treatment is performed anisotropically in the second processing step S205. That is, the exposed surface 11a of the substrate 11 and the side surface 12a of the guide pattern 12 are equally affected by the isotropic hydrophilization treatment in the first processing step S203, and only the exposed surface 11a of the substrate 11 is affected by the anisotropic hydrophobilization treatment in the second processing step S205. Therefore, when the hydrophilization treatment and the hydrophobilization treatment are sequentially performed, the wettability of the exposed surface 11a of the substrate 11 differs from the wettability of the side surface 12a of the guide pattern 12, i.e. the exposed surface 11a of the substrate 11 neutralized while the side surface 12a of the guide pattern 12 is maintained to be hydrophilic. As a result, the patterning process by the DSA is facilitated efficiently by sequentially performing the isotropic hydrophilization treatment and the anisotropic hydrophobilization treatment according to the embodiment.

(e) According to the embodiment, the treatment in the first processing step S203 is performed without the bias is not applied to the substrate 11, and the treatment in the second processing step S205 is performed with the bias applied to the substrate 11. That is, by performing the treatment in the second processing step S205 with the bias applied to the substrate 11, the amount of the plasma (fluorine ion) of the fluorine-containing gas reaching the side surface 12a of the guide pattern 12 may be reduced to be smaller than the amount of fluorine ion in the fluorine-containing gas reaching the surface 11a of the substrate 11 such that the wettability of the exposed surface 11a of the substrate 11 differs from the wettability of the side surface 12a of the guide pattern 12. As described above, according to the embodiment, by applying the bias, the isotropic treatment and the anisotropic treatment are performed effectively. Moreover, the degree of the neutralization may be controlled by adjusting the voltage of the bias when sequentially performing the hydrophilization treatment and the hydrophobilization treatment. As a result, the patterning process by the DSA is facilitated efficiently by controlling the wettability of the surface of the substrate 11.

(f) According to the embodiment, the treatment in the second processing step S205 is performed while the inner pressure of the process chamber 201 is maintained to be lower than the first processing step S203. When the treatment in the second processing step S205 is performed with the inner pressure of the process chamber 201 being lower than the first processing step S203, the amount of the plasma of the fluorine-containing gas reaching the side surface 12a of the guide pattern 12 is smaller than the amount of the plasma of the fluorine-containing gas reaching the surface 11a of the substrate 11 such that the wettability of the exposed surface 11a of the substrate 11 differs from the wettability of the side surface 12a of the guide pattern 12. As described above, according to the embodiment, by performing the treatment under different inner pressures, the isotropic treatment and the anisotropic treatment are performed effectively. Moreover, the degree of the neutralization may be controlled by adjusting the difference in the inner temperature when sequentially performing the hydrophilization treatment and the hydrophobilization treatment. As a result, the patterning process by the DSA is facilitated efficiently by controlling the wettability of the surface of the substrate 11.

(g) According to the embodiment, in order to appropriately adjust the deviation in the distribution of the inner temperature of the process chamber 201 due to the plasma generation, a zone control for adjusting temperature or a zone control for adjusting the bias applied to the substrate 11 is performed to ensure the uniformity at the surface of the substrate 11. As a result, the deviation of processing at the surface of the substrate 11 is suppressed even for large substrate, and the patterning process by DSA is facilitated.

(h) According to the embodiment, the purge step S204 is performed to supply purge gas into the process chamber 201 between the first processing step S203 and the second processing step S205. Accordingly, the hydrogen-containing gas supplied in the first processing step S203 and the fluorine-containing gas supplied in the second processing step S205 do not react with each other in the process chamber 201. That is, even when the hydrogen-containing gas and the fluorine-containing gas are supplied into the process chamber 201 in order to sequentially perform the hydrophilization treatment and the hydrophobilization treatment, the generation of hydrogen fluoride gas, which etches materials such as silicon and silicon oxide making up the substrate 11, is suppressed by the purge step S204 performed between the first processing step S203 and the second processing step S205.

<Other Embodiments>

While the embodiment has been described in detail, the above-described technique is not limited thereto. The above-described techniques may be variously modified without departing from the gist of the invention.

While the embodiment is exemplified by sequentially subjecting the substrate 11 to the hydrophilization treatment in the first processing step S203 and to the hydrophobization treatment in the second processing step S205, the technique is not limited thereto. For example, the substrate 11 may be subjected to the hydrophobization treatment first and to the hydrophilization treatment second to neutralize the exposed surface 11a of the substrate 11. That is, the substrate 11 may be subjected to one of the hydrophobization treatment and the hydrophilization treatment in the first processing step S203, and then to one of the hydrophilization treatment and the hydrophobization treatment in the second processing step S205, respectively.

While the embodiment is exemplified by sequentially subjecting the substrate 11 to the hydrophilization treatment using a hydrogen-containing gas such as $H_2$ gas and to the hydrophobization treatment using a fluorine-containing gas such as $F_2$ gas, the technique is not limited thereto. Specifically, different gases may be employed for the first process gas supplied in the first processing step S203 and the second process gas supplied in the second processing step S205 as long as the hydrophilization treatment and the hydrophobization treatment are performed properly.

While the embodiment is exemplified by using PS-PMMA as the DSA photoresist material 13, the above-described technique is not limited thereto. That is, the DSA photoresist material 13 may be a combination of two polymers having different molecular weights. Any material capable of forming a micro-phase separation structure by self-assembly as well as PS-PMMA may be used as the DSA photoresist material.

According to the technique described herein, the patterning process by the DSA may be performed appropriately and efficiently.

What is claimed is:

1. A method of manufacturing a semiconductor device, comprising: (a) accommodating iii a process chamber a substrate having a guide pattern thereon; (b) supplying a plasma of a first process gas into the process chamber to subject the substrate to first one of a first process for hydrophilizing the substrate and a second process for hydrophobizing the substrate: and (c) supplying a plasma of a second process gas into the process chamber to subject the substrate to second one of the first process and the second process other than the first one of the first process and the second process; wherein the first process gas and the second process gas comprise a hydrogen-containing gas and a fluorine-containing gas, respectively, when the first process the second process are performed in (b) and (c), respectively, and the first process gas and the second process gas comprise a fluorine-containing gas and a hydrogen-containing gas, respectively, when the second process and the first process are performed in (b) and (c), respectively.

2. The method of claim 1, wherein (b) is performed without a bias applied to the substrate, and (c) is performed with a bias applied to the substrate.

3. The method of claim 2, wherein an inner pressure of the process chamber in (c) is lower than that of the process chamber in (b).

4. The method of claim 3, further comprising: (d) supplying a purge gas into the process chamber between (b) and (c).

5. The method of claim 3, wherein the first process is performed isotropically, and the second process is performed anisotropically.

6. The method of claim 5, further comprising: (e) applying a self-assembly photoresist material containing a combination of two polymers having different molecular weights on the substrate.

7. The method of claim 2, further comprising: (d) supplying a purge gas into the process chamber between (b) and (c).

8. The method of claim 2, wherein the first process is performed isotropically, and the second process is performed anisotropically.

9. The method of claim 1, wherein an inner pressure of the process chamber in (c) is lower than that of the process chamber in (b).

10. The method of claim 1, further comprising: (d) supplying a purge gas into the process chamber between (b) and (c).

11. The method of claim 1, wherein the first process is performed isotropically, and the second process is performed anisotropically.

12. The method of claim 1, further comprising: (e) applying a self-assembly photoresist material containing a combination of two polymers having different molecular weights on the substrate.

13. The method of claim 1, wherein a wettability of an exposed surface of the substrate differs from that of a side surface of the guide pattern after (c) is performed.

14. The method of claim 1, further comprising: (e) applying a photoresist material containing two or more organic materials on an exposed surface of the substrate where the guide pattern is not formed.

* * * * *